(12) United States Patent
Hotta et al.

(10) Patent No.: US 11,606,056 B2
(45) Date of Patent: Mar. 14, 2023

(54) INVERTER UNIT

(71) Applicant: AISIN CORPORATION, Kariya (JP)

(72) Inventors: Yutaka Hotta, Anjo (JP); Seiji Yasui, Anjo (JP); Shinya Osuka, Anjo (JP)

(73) Assignee: AISIN CORPORATION, Kariya (JP)

( * ) Notice: Subject to any disclaimer, the term of this patent is extended or adjusted under 35 U.S.C. 154(b) by 70 days.

(21) Appl. No.: 17/274,028

(22) PCT Filed: Nov. 8, 2019

(86) PCT No.: PCT/JP2019/043883
§ 371 (c)(1),
(2) Date: Mar. 5, 2021

(87) PCT Pub. No.: WO2020/166150
PCT Pub. Date: Aug. 20, 2020

(65) Prior Publication Data
US 2021/0344295 A1    Nov. 4, 2021

(30) Foreign Application Priority Data

Feb. 12, 2019   (JP) ............................. JP2019-022894

(51) Int. Cl.
*H02P 27/06*    (2006.01)
*H05K 7/20*    (2006.01)

(52) U.S. Cl.
CPC .......... *H02P 27/06* (2013.01); *H05K 7/2089* (2013.01)

(58) Field of Classification Search
CPC .......... H02P 27/04; H02P 27/06; H02P 27/08; H02P 27/085; H02P 27/00; H02P 1/00; H02P 1/04; H02P 1/12; H02P 1/16; H02P 1/163; H02P 1/18; H02P 1/24; H02P 1/26; H02P 1/265; H02P 1/42; H02P 1/426; H02P 1/445; H02P 1/46; H02P 1/465; H02P 1/54; H02P 3/00; H02P 3/14; H02P 6/00; H02P 6/005; H02P 5/00; H02P 5/753; H02P 6/12; H02P 6/24; H02P 6/28; H02P 7/29;
(Continued)

(56) References Cited

U.S. PATENT DOCUMENTS

2008/0049477 A1   2/2008  Fujino et al.
2012/0160596 A1   6/2012  Yamasaki
(Continued)

FOREIGN PATENT DOCUMENTS

DE    10 2015 219018 A1    4/2017
JP       2011-182480 A      9/2011
(Continued)

OTHER PUBLICATIONS

Sep. 10, 2021 Search Report issued in European Patent Application No. 19914811.5.
(Continued)

*Primary Examiner* — Antony M Paul
(74) *Attorney, Agent, or Firm* — Oliff PLC (57) ABSTRACT

An inverter unit includes a switching element unit, a control board, a cooler, and an inverter case. The inverter case is integrally fixed to a rotating electrical machine case. The cooler is disposed so as to be in contact with the switching element unit on an opposite side to a rotating electrical machine side. The control board is disposed on the rotating electrical machine side of the switching element unit.

9 Claims, 5 Drawing Sheets

(58) Field of Classification Search
CPC .......... H02P 29/00; H02P 29/68; H02P 29/64; H02P 29/66; H02P 25/00; H02P 25/62; H02P 25/064; H02P 25/066; H02P 25/086; H02P 25/10; H02P 25/102; H02P 25/107; H02P 25/14; H02P 21/00; H02P 23/00; H05K 1/02; H05K 1/0201; H05K 1/0203; H05K 7/20927; H05K 7/2089; H05K 7/1432; H01L 23/34; G02F 1/133382; B60L 2240/425; B60L 2210/10; B60L 2210/40; B60K 6/405; B60K 6/445

See application file for complete search history.

(56) References Cited

U.S. PATENT DOCUMENTS

| | | | |
|---|---|---|---|
| 2012/0250384 A1 | 10/2012 | Ito et al. | |
| 2013/0049495 A1 | 2/2013 | Matsuo | |
| 2015/0199376 A1* | 7/2015 | Matsuo | G06F 16/178 707/626 |
| 2017/0158042 A1 | 6/2017 | Miyazawa et al. | |

FOREIGN PATENT DOCUMENTS

| | | |
|---|---|---|
| JP | 2012-143036 A | 7/2012 |
| JP | 2013-099214 A | 5/2013 |
| JP | 2013-183540 A | 9/2013 |
| JP | 2014-113915 A | 6/2014 |
| JP | 2016-005315 A | 1/2016 |
| JP | 2017-073948 A | 4/2017 |

OTHER PUBLICATIONS

Jan. 28, 2020 International Search Report issued in International Patent Application No. PCT/JP2019/0483883.

* cited by examiner

INVERTER UNIT

TECHNICAL FIELD

The present disclosure relates to an inverter unit.

BACKGROUND ART

A hybrid vehicle that uses both an internal combustion engine and a rotating electrical machine as a drive power source for wheels is used. Together with a drive device for such a hybrid vehicle there is provided an inverter unit for controlling the rotating electrical machine. The inverter unit may be provided separately from a rotating electrical machine case that contains the rotating electrical machine, but in order to suppress a wiring length to a short length, it is preferred that the inverter unit be integrated with the rotating electrical machine case.

An example of a drive unit in which a rotating electrical machine case is integrated with an inverter unit is disclosed in JP 2011-182480 A (Patent Literature 1). In a device of Patent Literature 1, a coolant channel [cooling path 37] is formed in a rotating electrical machine case [an outer housing 10 and an inner housing 11], and a switching element unit [power module 23], etc., are cooled by a coolant flowing through the coolant channel. The switching element unit, a first control board [gate drive board 22], a capacitor [smoothing capacitor 21], and a second control board [motor control board 20] are disposed in this order from a rotating electrical machine case side where the coolant channel is formed.

CITATIONS LIST

Patent Literature

Patent Literature 1: JP 2011-182480 A SUMMARY OF DISCLOSURE

Technical Problems

However, in the device of Patent Literature 1, since the coolant channel is formed in the rotating electrical machine case, first, the switching element unit needs to be assembled to the rotating electrical machine case. The rotating electrical machine case that contains the rotating electrical machine is often relatively large in size, and as a result of a great deal of handling of the rotating electrical machine case upon assembling, there has been a problem of poor assembly properties.

Hence, it is desired for an inverter unit integrated with a rotating electrical machine case to improve its assembly properties to the rotating electrical machine case.

Solutions to Problems

An inverter unit according to the present disclosure is an inverter unit for controlling a rotating electrical machine, the inverter unit including:

a switching element unit including switching elements that form an inverter circuit;

a control board that controls switching operation of the switching elements;

a cooler including, inside the cooler, a coolant channel through which a coolant passes; and an inverter case that contains the switching element unit, the control board, and the cooler, in which the inverter case is integrally fixed to a rotating electrical machine case that contains the rotating electrical machine, the cooler is disposed so as to be in contact with the switching element unit on an opposite side of the switching element unit from the rotating electrical machine side, and the control board is disposed on the rotating electrical machine side of the switching element unit.

According to this configuration, since the switching element unit is disposed being in contact with the cooler, the switching elements can be efficiently cooled. In addition, since the control board is disposed on the rotating electrical machine side of the cooler which is the same side as the switching element unit, the switching elements and the control board can be easily connected to each other at a short distance. Thus, performance of the inverter unit can be appropriately ensured. Furthermore, the switching element unit, the control board, and the cooler can be collectively handled being contained in the inverter case. Then, by integrally fixing the inverter case containing the switching element unit, the control board, and the cooler to the rotating electrical machine case, the assembly properties of the inverter unit to the rotating electrical machine case can be improved.

Further features and advantages of a technique according to the present disclosure will become more apparent from the following description of illustrative and non-restrictive embodiments which will be described with reference to drawings.

DESCRIPTION OF EMBODIMENTS

An embodiment of an inverter unit will be described with reference to the drawings. An inverter unit 1 of the present embodiment controls a rotating electrical machine 83 included in a vehicle drive device 8, and is used integrated with a drive device case 9 of the vehicle drive device 8. In the present embodiment, a drive unit 100 includes the vehicle drive device 8 and the inverter unit 1 integrated with the vehicle drive device 8 (see FIG. 3).

Figure 1:
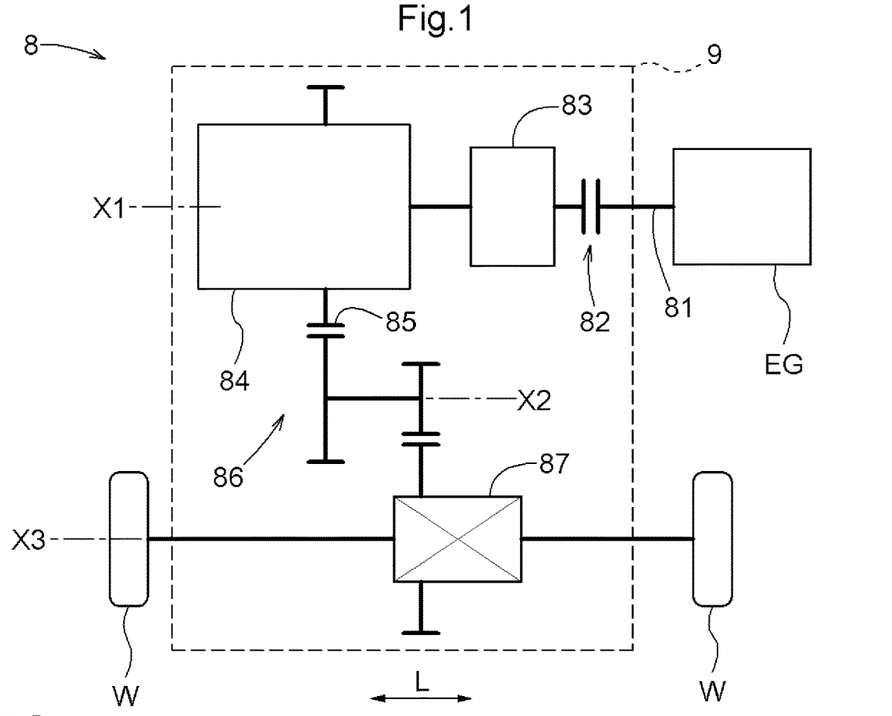
FIG. 1 is a schematic diagram of a drive unit according to an embodiment.

As shown in FIG. 1, the vehicle drive device 8 includes an input member 81 that is drive-coupled to an internal combustion engine EG, an engaging device 82, the rotating electrical machine 83, a transmission 84, and an output member 85 that is drive-coupled to wheels W. In addition, the vehicle drive device 8 includes a gear mechanism 86 and a differential gear device 87. The input member 81, the engaging device 82, the rotating electrical machine 83, the transmission 84, the output member 85, the gear mechanism 86, and the differential gear device 87 are provided in this order from an internal combustion engine EG side in a power transmission path that connects the internal combustion engine EG to the wheels W.

In addition, the input member 81, the engaging device 82, the rotating electrical machine 83, the transmission 84, and the output member 85 are disposed on a common first axis X1. The gear mechanism 86 is disposed on a second axis X2 different from the first axis X1. The differential gear device 87 is disposed on a third axis X3 different from the first axis X1 and the second axis X2. The first axis X1, the second axis X2, and the third axis X3 are parallel to each other, and a direction parallel to each of the axes is an axial direction L.

The input member 81 is drive-coupled to the internal combustion engine EG. The internal combustion engine EG is a prime mover (e.g., a gasoline engine, a diesel engine, etc.) that is driven by fuel combustion inside the engine to take out power. The input member 81 is drive-coupled so as to rotate together with an internal combustion engine output shaft (a crankshaft, etc.) which is an output shaft of the internal combustion engine EG. Note that the input member 81 and the internal combustion engine output shaft may be directly coupled together or may be coupled together through other members such as a damper. The input member 81 is drive-coupled to the rotating electrical machine 83 through the engaging device 82.

The engaging device 82 selectively couples the input member 81 (internal combustion engine EG) to the rotating electrical machine 83. In other words, the engaging device 82 is provided so as to be able to disconnect coupling between the input member 81 (internal combustion engine EG) and the rotating electrical machine 83. In the present embodiment, the engaging device 82 is a friction clutch, and for example, a multiplate wet clutch can be used.

The rotating electrical machine 83 includes a stator fixed to the drive device case 9 which is a non-rotating member; and a rotor that is rotatably supported on a radial inner side of the stator. The rotating electrical machine 83 is electrically connected to a direct-current power supply B through the inverter unit 1 (see FIG. 2). The rotating electrical machine 83 performs motoring by receiving electric power supply from the direct-current power supply B, or supplies and stores electric power generated by torque of the internal combustion engine EG, inertial force of a vehicle, etc., in the direct-current power supply B. The rotor of the rotating electrical machine 83 is drive-coupled to the transmission 84.

The transmission 84 of the present embodiment is constructed as a stepped automatic transmission. The transmission 84 includes, for example, a planetary gear mechanism and a plurality of a transmission engaging devices (not shown). The transmission engaging devices include one or a plurality of clutches and one or a plurality of brakes. They are friction clutches and friction brakes, and for example, multiplate wet clutches and multiplate wet brakes can be used. The transmission 84 can selectively form any one of a plurality of shift speeds, according to the state of engagement of each of the transmission engaging devices. The transmission 84 changes the speed of inputted rotation based on a gear ratio determined based on the formed shift speed, and outputs the rotation from the output member 85.

The output member 85 is drive-coupled to a pair of the left and right wheels W through the gear mechanism 86 and the differential gear device 87. Torque outputted from the output member 85 is transmitted to the two left and right wheels W in a distributed manner through the gear mechanism 86 and the differential gear device 87. By this, the vehicle drive device 8 can allow the vehicle to travel by transmitting torque from one or both of the internal combustion engine EG and the rotating electrical machine 83 to the wheels W.

Figure 3:
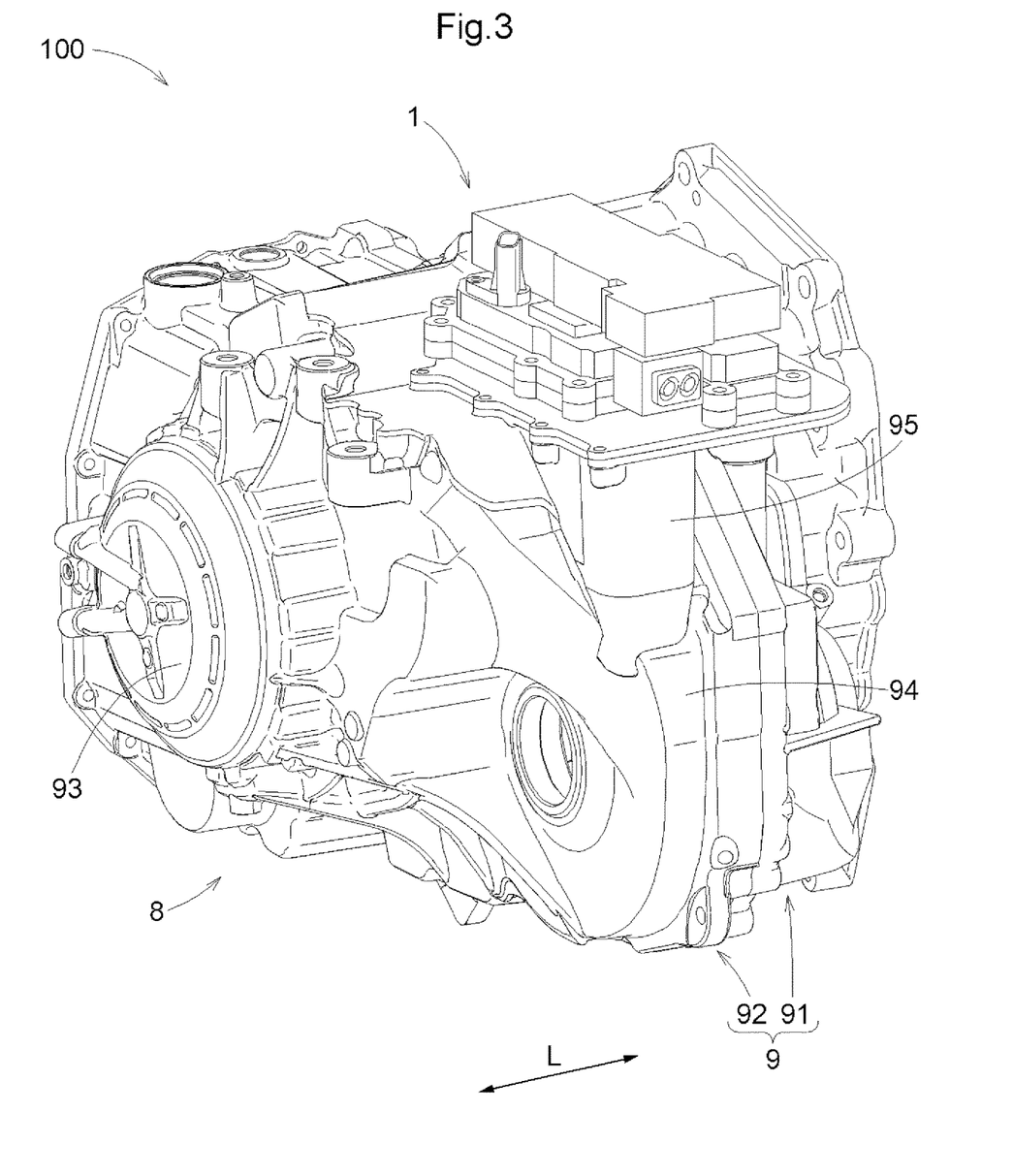
FIG. 3 is a perspective view of the drive unit.

The input member 81, the engaging device 82, the rotating electrical machine 83, the transmission 84, the output member 85, the gear mechanism 86, and the differential gear device 87 are contained in the drive device case 9. In the present embodiment, the drive device case 9 corresponds to a "rotating electrical machine case". As shown in FIG. 3, the drive device case 9 includes a first case part 91 and a second case part 92. The first case part 91 and the second case part 92 are joined together being in contact with each other in the axial direction L. In addition, the drive device case 9 includes an end wall part 93 that covers an end part on one side (transmission 84 side) in the axial direction L, and an outer wall part 94 that covers around the rotating electrical machine 83, the transmission 84, the gear mechanism 86, the differential gear device 87, and the like.

Figure 7:
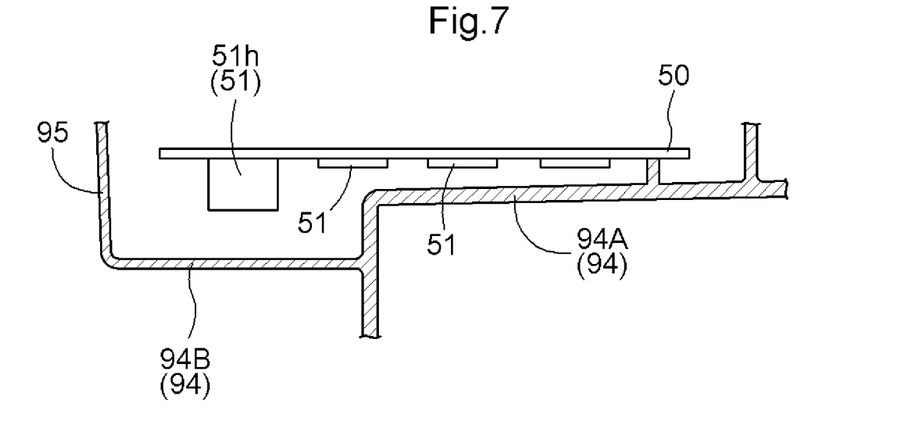
FIG. 7 is a VII-VII cross-sectional view of FIG. 6.

The outer wall part 94 includes a large diameter part 94A and a small diameter part 94B smaller in diameter than the large diameter part 94A (see FIG. 7). In addition, the drive device case 9 includes a protruding wall part 95 that protrudes toward an outer circumferential side from the outer wall part 94. The protruding wall part 95 is formed so as to protrude roughly upward in a vertical direction (up-down direction in FIG. 3). With the protruding wall part 95 being a mount, the inverter unit 1 is integrally fixed to the top of the protruding wall part 95.

Figure 2:
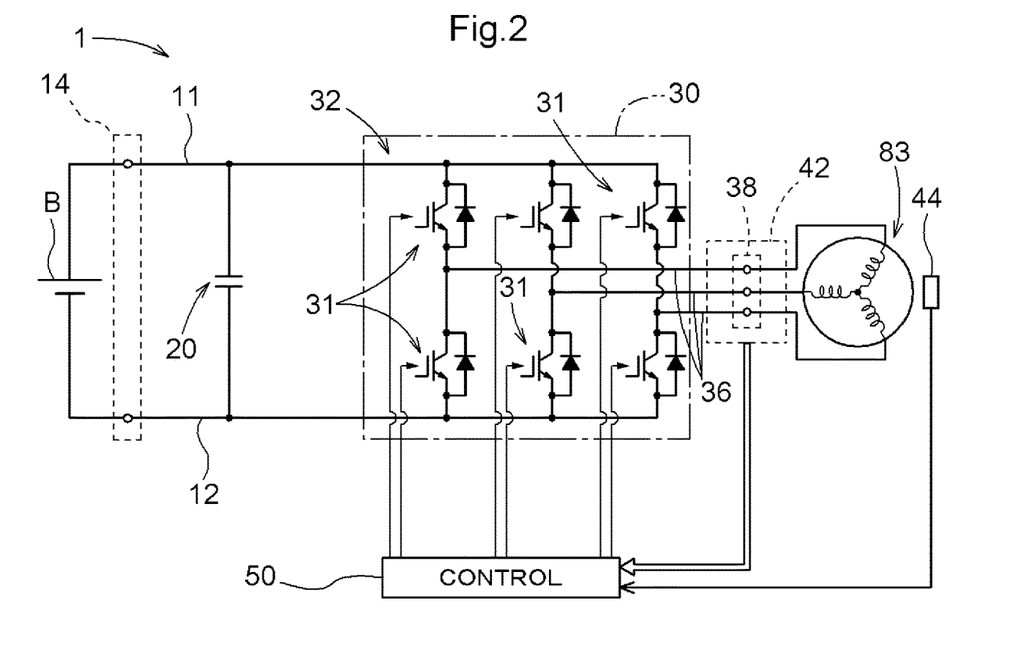
FIG. 2 is a circuit diagram of an inverter unit.

As shown in FIG. 2, the rotating electrical machine 83 is electrically connected to the direct-current power supply B through the inverter unit 1. The direct-current power supply B is a secondary battery (battery) such as a nickel-hydrogen battery or a lithium-ion battery, an electric double-layer capacitor, etc. The direct-current power supply B and the inverter unit 1 are electrically connected to each other through power supply terminals 14.

The inverter unit 1 includes a positive bus bar 11, a negative bus bar 12, a capacitor 20, a switching element unit 30, three-phase bus bars 36, a current sensor 42, and a control board 50. The positive bus bar 11 is connected to a positive polarity of the direct-current power supply B. The negative bus bar 12 is connected to a negative polarity of the direct-current power supply B. The capacitor 20 is connected to the positive bus bar 11 and the negative bus bar 12, and smooths a voltage between both positive and negative polarities. In the present embodiment, the capacitor 20 includes a plurality of capacitor elements 21 (see FIG. 5).

The switching element unit 30 includes a plurality of switching elements 31. The plurality of switching elements 31 form an inverter circuit 32. The inverter circuit 32 includes a bridge circuit including arms corresponding to a plurality of phases, respectively. In the present embodiment, the rotating electrical machine 83 is a three-phase alternating-current rotating electrical machine, and the inverter circuit 32 includes a bridge circuit including three-phase arms corresponding to a U-phase, a V-phase, and a W-phase of stator coils of the rotating electrical machine 83, respectively. An arm of each phase includes two switching elements 31 connected in series with each other between both positive and negative polarities, and the inverter circuit 32 (bridge circuit) is formed by connecting the arms of the respective phases in parallel to each other.

Note that for the switching elements 31, it is possible to use power semiconductor devices such as Insulated Gate Bipolar Transistors (IGBTs), power Metal Oxide Semiconductor Field Effect Transistors (MOSFETs), Silicon Carbide-Metal Oxide Semiconductor FETs (SiC-MOSFETs), and SiC-Static Induction Transistors (SiC-SITs). In addition, a freewheeling diode is connected in parallel to each switching element 31. In the present embodiment, the inverter circuit 32 with three-phase arms each including switching elements 31 and a freewheeling diode is formed into a unit as the switching element unit 30.

The three-phase bus bars 36 connect the inverter circuit 32 to the rotating electrical machine 83. The three-phase bus bars 36 each play a partial role in electrically connecting a midpoint between two switching elements 31 included in an arm of a corresponding phase to a stator coil of a corresponding phase of the rotating electrical machine 83. In the present embodiment, the three-phase bus bars 36 each electrically connects a midpoint between two switching elements 31 included in an arm of each phase to a corresponding one of three-phase terminals 38. The three-phase bus bars 36 are connected to the stator coils of the respective phases of the rotating electrical machine 83 through the three-phase terminals 38 and three-phase cables connected to the three-phase terminals 38. In the present embodiment, the three-phase bus bars 36 correspond to "wiring members".

The current sensor 42 detects currents flowing through the three-phase bus bars 36. The current sensor 42 may individually detect currents flowing through the respective three-phase bus bars 36 corresponding to the stator coils of three phases of the rotating electrical machine 83, or may detect only currents for two phases and obtain a current for the remaining one phase by computation.

The control board 50 controls switching operation of the switching elements 31. On the control board 50 there is constructed an inverter control part (CONTROL) using a logic circuit such as a microcomputer as a core member. A current flowing through each of the three-phase bus bars 36 and detected by the current sensor 42 is inputted to the control board 50 (inverter control part). In addition, a magnetic pole position and a rotational speed at each time point of the rotor of the rotating electrical machine 83 are detected by a rotation sensor 44, e.g., a resolver, and information on results of the detection is also inputted to the control board 50 (inverter control part). The control board 50 (inverter control part) performs on/off control of each switching element 31 by performing current feedback control that uses, for example, a vector control method, based on the above-described pieces of information and vehicle required torque.

Figure 4:
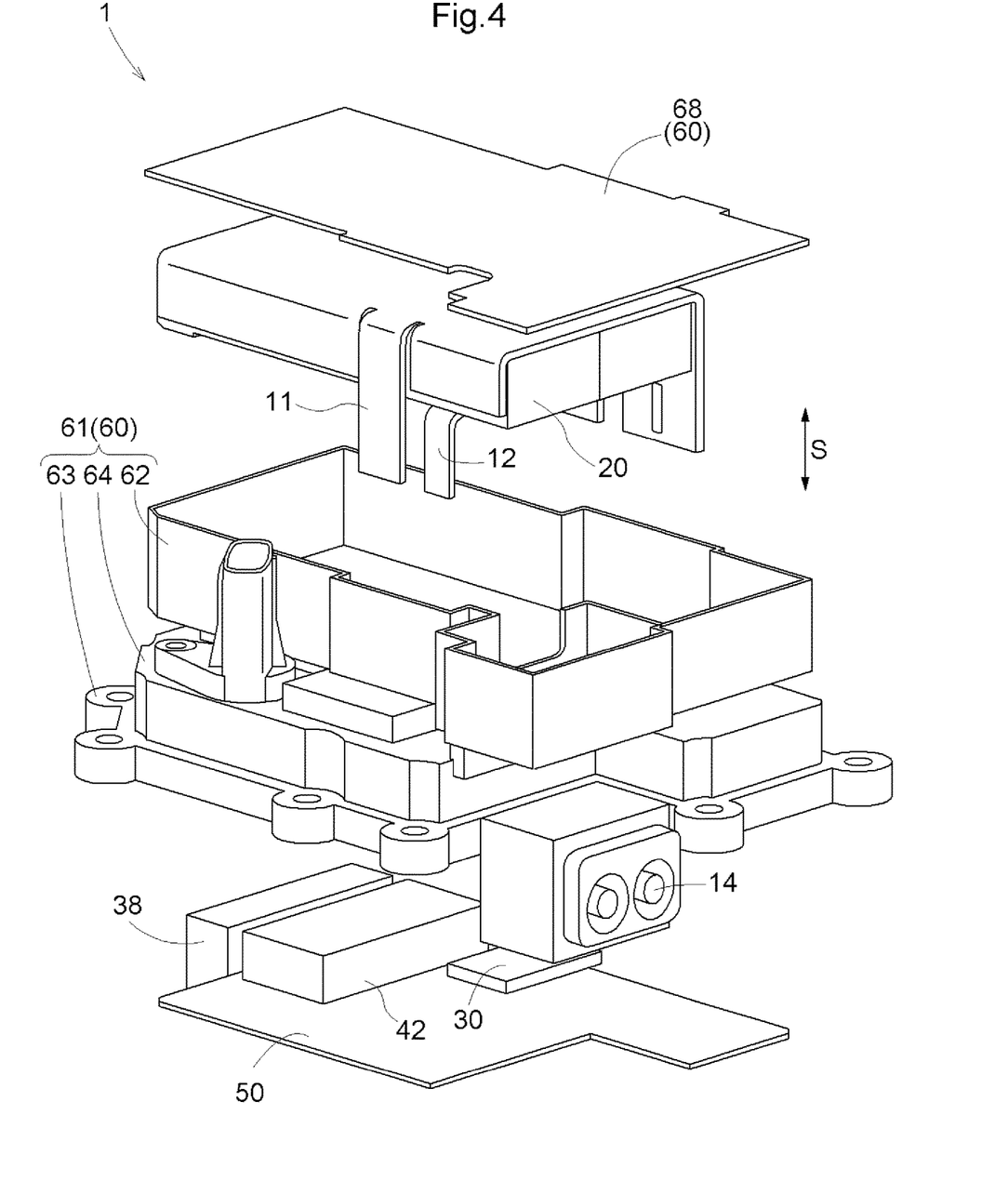
FIG. 4 is an exploded perspective view of the inverter unit.
Figure 5:
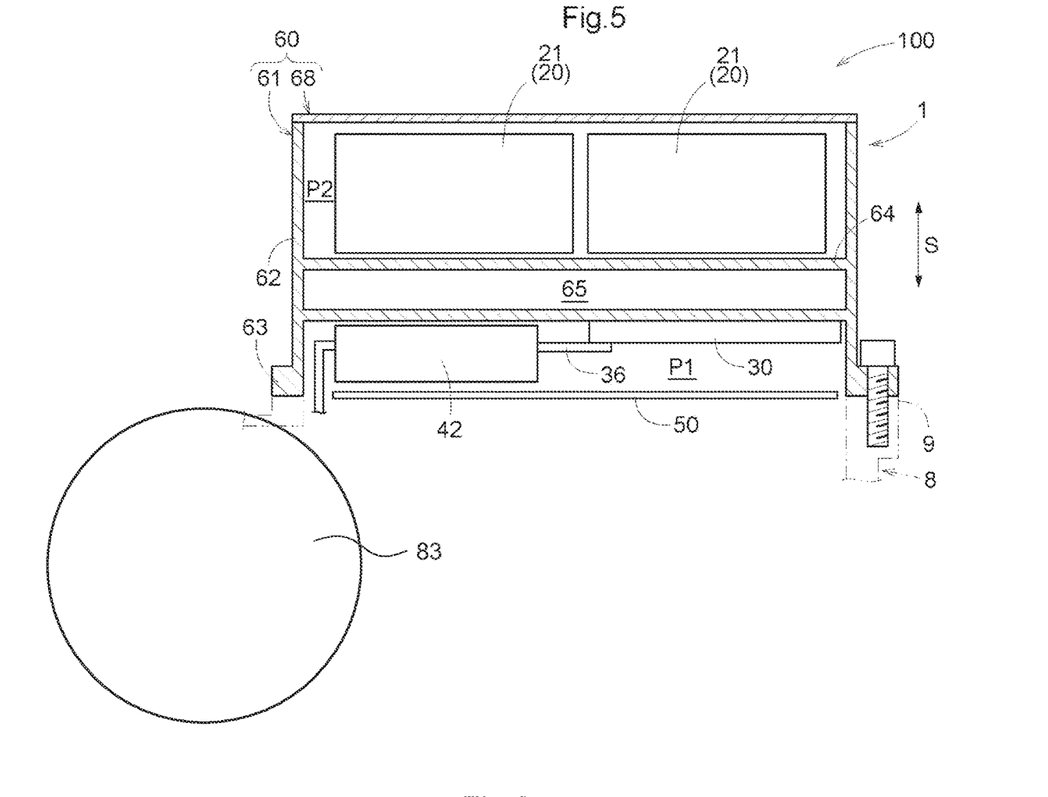
FIG. 5 is a schematic layout diagram of the inverter unit.

As shown in FIGS. 4 and 5, the capacitor 20, the switching element unit 30, the three-phase bus bars 36, the current sensor 42, and the control board 50 are contained in an inverter case 60 that is integrally fixed to the drive device case 9. Here, the inverter case 60 includes a case main body 61 and a case cover 68 attached to the case main body 61. The case main body 61 includes an outer wall part 62 that surrounds a containment space for the switching element unit 30, etc.; and a flange part 63 which is a part provided at a lower end part and attached to the drive device case 9 (protruding wall part 95).

In addition, the case main body 61 includes a heatsink part 64 in a mid-region thereof. Inside the heatsink part 64 there is formed a coolant channel 65 through which a coolant passes. In the present embodiment, the heatsink part 64 corresponds to a "cooler". The heatsink part 64 including the coolant channel 65 may be of either an air cooling system or a water cooling system, but the water cooling system is preferred in terms of cooling efficiency. Note that as in the present embodiment, even in a configuration in which a part of the case main body 61 forming the inverter case 60 is the heatsink part 64, it is considered that the heatsink part 64 is contained in the inverter case 60.

In the present embodiment, the internal space of the case main body 61 is divided into two spaces (a first containment space P1 and a second containment space P2), with the heatsink part 64 being a boundary therebetween. The first containment space P1 is a space located more on a drive device case 9 side (rotating electrical machine 83 side) than the heatsink part 64. The second containment space P2 is a space located more on an outer side than the heatsink part 64 (an opposite side to a drive device case 9 and rotating electrical machine 83 side). In the present embodiment, the first containment space P1 contains the switching element unit 30, the three-phase bus bars 36, the current sensor 42, and the control board 50, and the second containment space P2 contains the capacitor 20.

In the first containment space P1, the switching element unit 30 is disposed so as to be in contact with a plane on the drive device case 9 side (rotating electrical machine 83 side) of the heatsink part 64. When this disposition is viewed from the point of view of the heatsink part 64, the heatsink part 64 is disposed so as to be in contact with the switching element unit 30 on the opposite side of the switching element unit 30 from the drive device case 9 side (rotating electrical machine 83 side).

The current sensor 42 is disposed so as to be slightly spaced apart from the plane on the drive device case 9 side (rotating electrical machine 83 side) of the heatsink part 64. In addition, the current sensor 42 is disposed so as to include the same location as the switching element unit 30 in a direction in which the parts included in the inverter unit 1 are stacked on top of each other (stacked direction S), and to be located on the drive device case 9 side (rotating electrical machine 83 side). In addition, the current sensor 42 is disposed at a location adjacent to the switching element unit 30 without overlapping the switching element unit 30 as viewed in the stacked direction S.

The three-phase bus bars 36 are disposed so as to be in contact with a plane on the drive device case 9 side (rotating electrical machine 83 side) of the switching element unit 30. In addition, the three-phase bus bars 36 are disposed enclosed by the current sensor 42. The three-phase bus bars 36 connected to the three-phase terminals 38 (see FIG. 4) are disposed only in an internal space surrounded by the inverter case 60 and the drive device case 9 without coming out of the internal space surrounded by the inverter case 60 and the drive device case 9. Furthermore, in the present embodiment, the three-phase bus bars 36 are disposed only in a space on an inverter case 60 side.

The control board 50 is disposed on the drive device case 9 side (rotating electrical machine 83 side) of both the switching element unit 30 and the current sensor 42. In other words, the control board 50 is disposed farthest to the drive device case 9 side (rotating electrical machine 83 side) in the stacked direction S among the parts included in the inverter unit 1. In addition, the control board 50 is disposed so as to be slightly spaced apart in the stacked direction S from the current sensor 42 which is one of the switching element unit 30 and the current sensor 42 located more on the drive device case 9 side (rotating electrical machine 83 side). The control board 50 is formed in comparable size to the heatsink part 64 and disposed parallel to the heatsink part 64.

In this manner, the switching element unit 30 and the current sensor 42 are disposed so as to be adjacent to each other in a direction orthogonal to the stacked direction S, between the heatsink part 64 and the control board 50 which are disposed so as to be parallel to each other with a predetermined spacing in the stacked direction S therebetween. When this disposition is viewed from the point of view of the current sensor 42, the current sensor 42 is disposed on a switching element unit 30 side of the control board 50.

Figure 6:
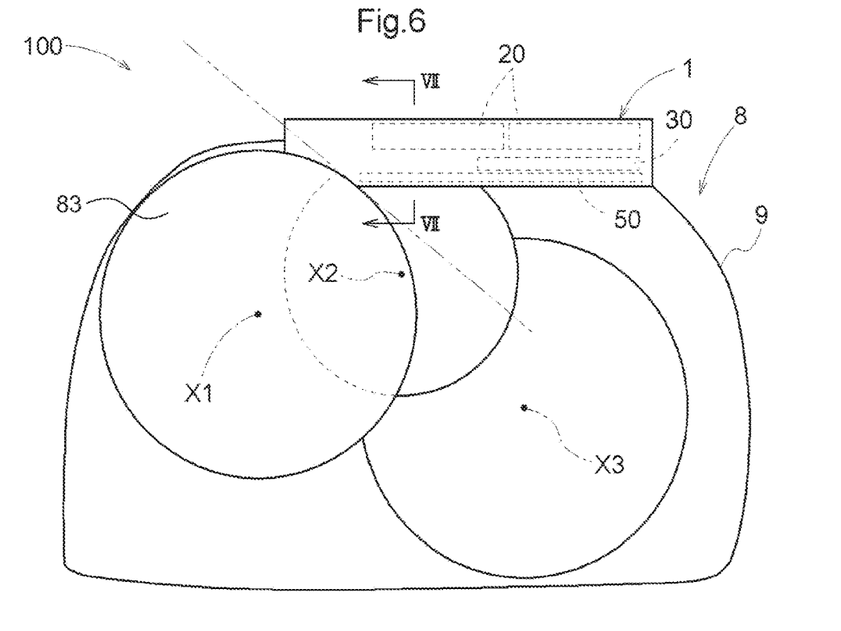
FIG. 6 is a schematic diagram of the drive unit viewed from an axial direction.

In addition, as shown in FIG. 6, the control board 50 is disposed in a direction intersecting a tangential direction (represented by a dashed-double-dotted line in FIG. 6) at a point closest to the control board 50 in the rotating electrical machine 83 as viewed in the axial direction L. In the present embodiment, the tangential direction at a point closest to the control board 50 in the rotating electrical machine 83 is a direction inclined with respect to a vertical direction (up-down direction in FIG. 6) as viewed in the axial direction L. On the other hand, the control board 50, the switching element unit 30, the heatsink part 64, and the like, are disposed in a substantially horizontal direction (a direction orthogonal to the vertical direction). By this, as described above, while the configuration is such that of the parts included in the inverter unit 1, the control board 50 is disposed farthest to the drive device case 9 side, heat can be made less likely to be transferred to the control board 50.

In addition, the control board 50 and the like are disposed so as to include a region between the first axis X1 on which the rotating electrical machine 83 and the like are disposed and the third axis X3 on which the differential gear device 87 is disposed as viewed in the axial direction L. By this, while heat is made less likely to be transferred to the control board 50, an increase in the size of the entire drive unit 100 can be suppressed.

As shown in FIG. 7, on the control board 50, various circuit parts 51 for constructing a logic circuit are mounted on a plane on the drive device case 9 side (rotating electrical machine 83 side) of the control board 50. Furthermore, of the plurality of circuit parts 51, a most protruding part 51h whose protrusion height from the control board 50 (protrusion height toward the drive device case 9 side) is highest is disposed in the small diameter part 94B which is one of the large diameter part 94A and the small diameter part 94B of the outer wall part 94 of the drive device case 9. By thus making an outside shape of the drive device case 9 (outer wall part 94) and a schematic shape of the control board 50 including also the circuit parts 51 complementary, the entire inverter unit 1 can be disposed so as to be closest possible to the drive device case 9. Thus, miniaturization of the entire drive unit 100 can be achieved.

The capacitor 20 is disposed in the second containment space P2 which is formed on the opposite side of the heatsink part 64 from a side disposed in the first containment space P1. The capacitor 20 is disposed resin-molded in the tank-shaped second containment space P2. The capacitor 20 is disposed on the opposite side of the heatsink part 64 from the switching element unit 30 side. In other words, the capacitor 20 is disposed at the outermost location (location distanced from the drive device case 9) in the stacked direction S among the parts included in the inverter unit 1. In many cases, the capacitor 20 includes a collection of a plurality of capacitor elements 21 and has a high degree of flexibility in disposition compared to other components, and thus, by disposing the capacitor 20 at the outermost location, the degree of flexibility in the outside shape of the inverter unit 1 can be increased.

Figure 8:
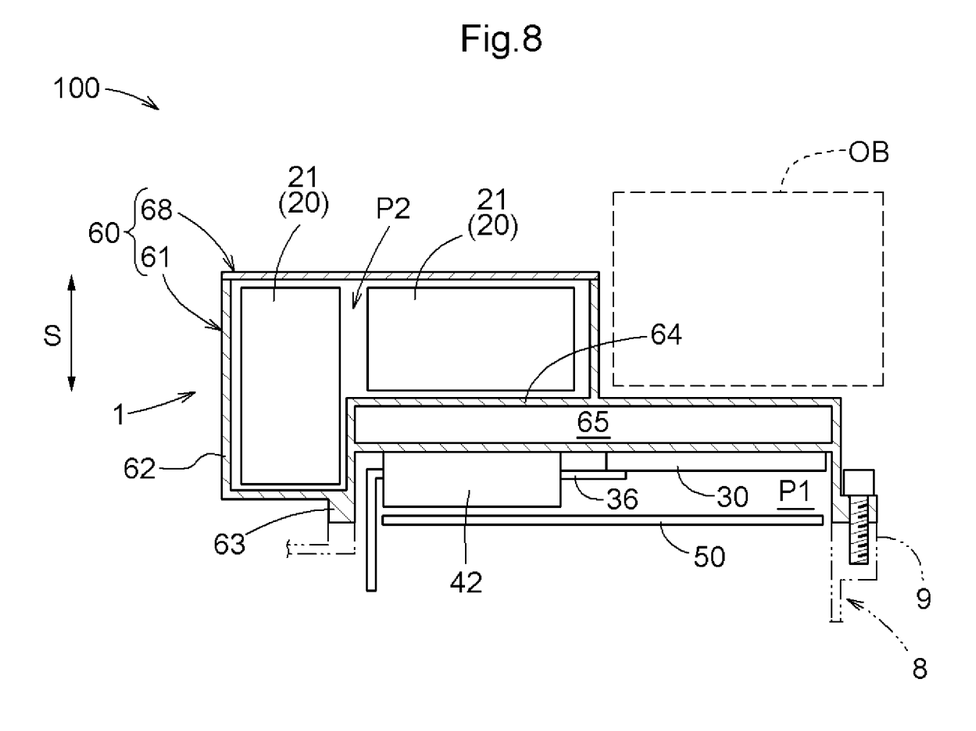
FIG. 8 is a schematic layout diagram of the inverter unit in a different mode.

Due to the specifications of a vehicle side, upon mounting the drive unit 100 on the vehicle, for example, as shown in FIG. 8, an obstacle OB such as an in-vehicle part or a vehicle body frame may interfere with a top region of the inverter unit 1. In such a case, as shown in the drawing, one or more of the plurality of capacitor elements 21 included in the capacitor 20 may be allowed to move to a location where there is no interference with the obstacle OB, and the inverter case 60 may be formed in shape corresponding to the disposition in that case. As such, since the outside shape of the inverter unit 1 can be changed as appropriate according to the specifications of the vehicle side, the range of vehicle types on which the drive unit 100 can be mounted can be widened.

Furthermore, a disposition configuration of the above-described parts goes along with the flow of electric power "the capacitor 20 the switching element unit 30 the current sensor 42 the rotating electrical machine 83" in the inverter unit 1. Thus, the length of the three-phase bus bars 36 extending toward the rotating electrical machine 83 side from the switching element unit 30 can be suppressed to a minimum.

For integration of the inverter unit 1 and the drive device case 9, it is possible to adopt an assembly method in which with each part fixed to the inverter case 60, the inverter case 60 is fixed to the drive device case 9. In this case, the switching element unit 30, the three-phase bus bars 36, the current sensor 42, and the control board 50 are fixed to the first containment space P1 of the inverter case 60, and the positive bus bar 11, the negative bus bar 12, and the capacitor 20 are fixed to the second containment space P2. Then, the inverter case 60 having each part fixed thereto is finally fixed to the drive device case 9. Since the inverter unit 1 is just assembled alone and finally fixed to the drive device case 9, the assembly properties of the inverter unit 1 to the drive device case 9 can be improved.

Other Embodiments (1) The above-described embodiment describes, as an example, a configuration in which the capacitor 20 is disposed on the opposite side of the heatsink part 64 from the switching element unit 30 side. However, the configuration is not limited thereto, and the capacitor 20 may be disposed on the switching element unit 30 side (drive device case 9 and rotating electrical machine 83 side) of the heatsink part 64.

(2) The above-described embodiment describes, as an example, a configuration in which the current sensor 42 is disposed on the switching element unit 30 side of the control board 50. However, the configuration is not limited thereto, and the current sensor 42 may be disposed on the opposite side of the control board 50 from the switching element unit 30 side (on the drive device case 9 and rotating electrical machine 83 side of the control board 50).

(3) The above-described embodiment describes, as an example, a configuration in which the control board 50 is disposed in a direction intersecting a tangential direction at a point closest to the control board 50 in the rotating electrical machine 83 as viewed in the axial direction L. However, the configuration is not limited thereto, and the control board 50 may be disposed in a direction parallel to the tangential direction as viewed in the axial direction L.

(4) The above-described embodiment describes, as an example, a configuration in which a part of the case main body 61 forming the inverter case 60 is the heatsink part 64. However, the configuration is not limited thereto, and the heatsink part 64 may be formed as a completely different part from the case main body 61.

(5) The above-described embodiment describes, as an example, a configuration in which the three-phase bus bars 36 are disposed only in the inverter case 60. However, the configuration is not limited thereto, and at least one of the three-phase bus bars 36 may be disposed outside the inverter case 60. For example, the three-phase bus bars 36 may be disposed across a space on the inverter case 60 side and a space on the drive device case 9 side. Alternatively, at least one of the three-phase bus bars 36 may be disposed outside an internal space surrounded by the inverter case 60 and the drive device case 9.

(6) The above-described embodiment describes, as an example, a configuration in which the most protruding part 51*h* among the plurality of circuit parts 51 mounted on the control board 50 is disposed in the small diameter part 94B of the outer wall part 94 of the drive device case 9. However, the configuration is not limited thereto, and the most protruding part 51*h* may be disposed in the large diameter part 94A of the outer wall part 94. In addition, the outer wall part 94 of the drive device case 9 may not include the large diameter part 94A and the small diameter part 94B in the first place. As such, an outside shape of the drive device case 9 (outer wall part 94) and a schematic shape of the control board 50 including also the circuit parts 51 do not necessarily need to be complementary.

(7) The above-described embodiment describes, as an example, a configuration in which the circuit parts 51 are mounted on a plane on the drive device case 9 side (rotating electrical machine 83 side) of the control board 50. However, the configuration is not limited thereto, and the circuit parts 51 may be mounted on a plane on a heatsink part 64 side (an opposite side to the drive device case 9 and rotating electrical machine 83 side) of the control board 50.

(8) A configuration disclosed in each of the above-described embodiments (including the above-described embodiment and other embodiments; the same applies hereinafter) can also be applied in combination with a configuration disclosed in other embodiments as long as a contradiction does not arise. For other configurations, too, the embodiments disclosed in this specification are in all respects illustrative, and modifications can be made as appropriate without departing from the spirit and scope of the present disclosure.

SUMMARY OF THE EMBODIMENTS

In summary of the above description, an inverter unit (1) according to the present disclosure preferably has the following configurations.

An inverter unit (1) for controlling a rotating electrical machine (83) includes:

a switching element unit (30) including switching elements (31) that form an inverter circuit (32);

a control board (50) that controls switching operation of the switching elements (31);

a cooler (64) including, inside the cooler (64), a coolant channel (65) through which a coolant passes; and an inverter case (60) that contains the switching element unit (30), the control board (50), and the cooler (64), and the inverter case (60) is integrally fixed to a rotating electrical machine case (9) that contains the rotating electrical machine (83), the cooler (64) is disposed so as to be in contact with the switching element unit (30) on an opposite side of the switching element unit (30) from the rotating electrical machine (83) side, and the control board (50) is disposed on the rotating electrical machine (83) side of the switching element unit (30).

According to this configuration, since the switching element unit (30) is disposed being in contact with the cooler (64), the switching elements (31) can be efficiently cooled. In addition, since the control board (50) is disposed on the rotating electrical machine (83) side of the cooler (64) which is the same side as the switching element unit (30), the switching elements (31) and the control board (50) can be easily connected to each other at a short distance. Thus, performance of the inverter unit (1) can be appropriately ensured. Furthermore, the switching element unit (30), the control board (50), and the cooler (64) can be collectively handled being contained in the inverter case (60). Then, by integrally fixing the inverter case (60) containing the switching element unit (30), the control board (50), and the cooler (64) to the rotating electrical machine case (9), the assembly properties of the inverter unit (1) to the rotating electrical machine case (9) can be improved.

In one aspect, it is preferred that the inverter unit (1) further include a current sensor (42) that detects currents flowing through wiring members (36) that connect the inverter circuit (32) to the rotating electrical machine (83), and the current sensor (42) be disposed on the switching element unit (30) side of the control board (50).

According to this configuration, the wiring members (36) that connect the inverter circuit (32) to the rotating electrical machine (83) can be disposed along a rational path. Thus, the total length of the wiring members (36) can be suppressed to a short length.

In one aspect, it is preferred that the wiring members (36) be disposed only in an internal space surrounded by the inverter case (60) and the rotating electrical machine case (9).

According to this configuration, since the wiring members (36) are disposed only in an internal space surrounded by the inverter case (60) and the rotating electrical machine case (9) and do not come out of the cases, the total length of the wiring members (36) can be further suppressed to a short length.

In one aspect, it is preferred that the inverter unit (1) further include a capacitor (20) that is electrically connected between a direct-current power supply and the inverter circuit (32), and the capacitor (20) be disposed on an opposite side of the cooler (64) from the switching element unit (30) side.

According to this configuration, it becomes possible for the cooler (64) to make heat from the switching element unit (30) side less likely to be transferred to a capacitor (20) side, or for the cooler (64) to cool the capacitor (20). In addition, by providing the capacitor (20) having a high degree of flexibility in disposition at the most distant location from the rotating electrical machine case (9), it facilitates changing an overall outside shape of the integrated inverter unit (1) and rotating electrical machine case (9).

In one aspect, it is preferred that the control board (50) be disposed in a direction intersecting a tangential direction at a point closest to the control board (50) in the rotating electrical machine (83) as viewed in an axial direction (L).

According to this configuration, compared to a configuration in which the control board (50) is disposed in a tangential direction at the closest point in the rotating electrical machine (83), a large spaced distance of the control board (50) from the rotating electrical machine (83) can be kept. Thus, heat generated by driving of the rotating electrical machine (83) can be made less likely to be transferred to the control board (50).

In one aspect, it is preferred that the rotating electrical machine case (9) include a large diameter part (94A) and a small diameter part (94B) smaller in diameter than the large diameter part (94A), and of circuit parts (51) mounted on the control board (50), a most protruding part (51h) whose protrusion height from the control board (50) is highest be disposed in the small diameter part (94B).

According to this configuration, by disposing the most protruding part (51h) on the control board (50) using a recess of the small diameter part (94B) of the rotating electrical machine case (9), the control board (50), eventually the entire inverter unit (1), can be disposed so as to be closest possible to a rotating electrical machine case (9) side. Thus, overall miniaturization of the integrated inverter unit (1) and rotating electrical machine case (9) can be achieved.

The inverter unit according to the present disclosure can provide at least one of the above-described advantageous effects.

REFERENCE SIGNS LIST

1: Inverter unit, 9: Drive device case (rotating electrical machine case), 20: Capacitor, 30: Switching element unit, 31: Switching element, 32: Inverter circuit, 36: Three-phase bus bar (wiring member), 42: Current sensor, 50: Control board, 51: Circuit part, 51h: Most protruding part, 60: Inverter case, 64: Heatsink part (cooler), 65: Coolant channel, 83: Rotating electrical machine, 94A: Large diameter part, 94B: Small diameter part, B: Direct-current power supply, and L: Axial direction

The invention claimed is:

1. An inverter unit for controlling a rotating electrical machine, the inverter unit comprising:
   a switching element unit including switching elements that form an inverter circuit;
   a control board that controls switching operation of the switching elements;
   a cooler including, inside the cooler, a coolant channel through which a coolant passes; and
   an inverter case that contains the switching element unit, the control board, and the cooler,
   wherein
   the inverter case is integrally fixed to a rotating electrical machine case that contains the rotating electrical machine,
   the cooler is disposed so as to be in contact with the switching element unit on an opposite side of the switching element unit from the rotating electrical machine side, and
   the control board is disposed on the rotating electrical machine side of the switching element unit.

2. The inverter unit according to claim 1, further comprising:
   a current sensor that detects currents flowing through wiring members that connect the inverter circuit to the rotating electrical machine,
   wherein
   the current sensor is disposed on the switching element unit side of the control board.

3. The inverter unit according to claim 2, wherein the wiring members are disposed only in an internal space surrounded by the inverter case and the rotating electrical machine case.

4. The inverter unit according to claim 3, further comprising:
   a capacitor that is electrically connected between a direct-current power supply and the inverter circuit,
   wherein
   the capacitor is disposed on an opposite side of the cooler from the switching element unit side.

5. The inverter unit according to claim 4, wherein the control board is disposed in a direction intersecting a tangential direction at a point closest to the control board in the rotating electrical machine as viewed in an axial direction.

6. The inverter unit according to claim 5, wherein
   the rotating electrical machine case includes a large diameter part and a small diameter part smaller in diameter than the large diameter part, and
   of circuit parts mounted on the control board, a most protruding part whose protrusion height from the control board is highest is disposed in the small diameter part.

7. The inverter unit according to claim 1, further comprising a capacitor that is electrically connected between a direct-current power supply and the inverter circuit,
   wherein
   the capacitor is disposed on an opposite side of the cooler from the switching element unit side.

8. The inverter unit according to claim 1, wherein the control board is disposed in a direction intersecting a tangential direction at a point closest to the control board in the rotating electrical machine as viewed in an axial direction.

9. The inverter unit according to claim 1, wherein
   the rotating electrical machine case includes a large diameter part and a small diameter part smaller in diameter than the large diameter part, and
   of circuit parts mounted on the control board, a most protruding part whose protrusion height from the control board is highest is disposed in the small diameter part.

* * * * *